United States Patent [19]

Tajima

[11] Patent Number: 4,931,849
[45] Date of Patent: Jun. 5, 1990

[54] SEMICONDUCTOR MEMORY DEVICE WITH IMPROVED CAPACITOR STRUCTURE

[75] Inventor: Junji Tajima, Tokyo, Japan

[73] Assignee: NEC Corporation, Tokyo, Japan

[21] Appl. No.: 220,273

[22] Filed: Jul. 18, 1988

[30] Foreign Application Priority Data

Jul. 16, 1987 [JP] Japan ................................ 62-178260

[51] Int. Cl.⁵ ...................... H01L 27/04; G11C 11/40
[52] U.S. Cl. ................... 357/23.6; 365/149; 365/210
[58] Field of Search ................ 357/23.6, 51; 365/149, 365/210

[56] References Cited

U.S. PATENT DOCUMENTS

| | | | |
|---|---|---|---|
| 4,638,460 | 1/1987 | Matsumoto | 357/23.6 |
| 4,641,279 | 2/1987 | Kimuna | 365/149 |
| 4,651,306 | 3/1987 | Yanagisawa | 365/149 |
| 4,810,290 | 3/1989 | Watanabe | 365/210 |

FOREIGN PATENT DOCUMENTS 61-233497  10/1986  Japan ................................. 365/149

Primary Examiner—William D. Larkins
Attorney, Agent, or Firm—Sughrue, Mion, Zinn, Macpeak & Seas

[57] ABSTRACT

A semiconductor device provided with capacitors which have accurate and reliable capacitance ratio, is disclosed. The semiconductor device comprises first and second capacitors. The first and second capacitors have substantially the same physical configuration but they have different dielectric layers of different values of dielectric constant. Thus, a capacitance ratio of the first capacitor to the second capacitor is determined in accordance with the dielectric constant ratio of the dielectric layers thereof.

8 Claims, 4 Drawing Sheets

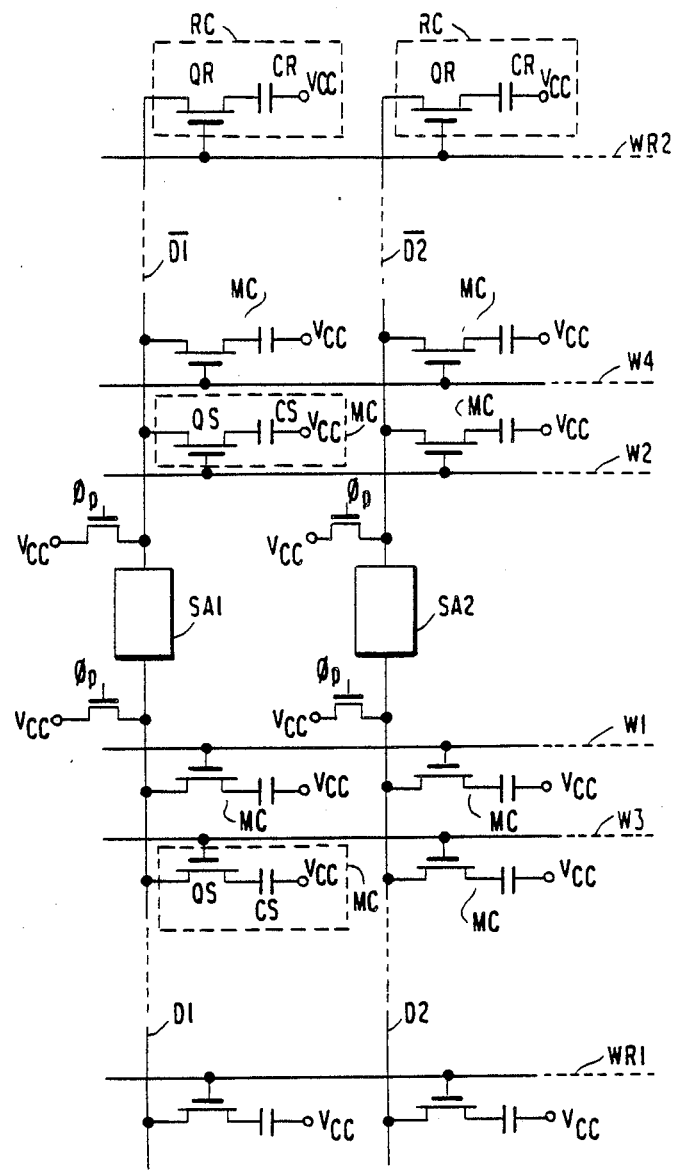

SEMICONDUCTOR MEMORY DEVICE WITH IMPROVED CAPACITOR STRUCTURE

BACKGROUND OF THE INVENTION:

The present invention relates to a semiconductor memory device, and more particularly to a dynamic type semiconductor memory device employing one-transistor type memory cells.

As dynamic type memory devices, so-called one-transistor type memories which employ one transistor type memory cells each composed of one transistor and one capacitor, have been widely utilized in various fields. Such dynamic type memory devices have at least one array of memory cells in which a large number of one transistor type memory cells are arranged in a matrix form of rows and columns. A plurality of word lines are arranged in rows and a plurality of pairs of digit lines and a plurality of sense amplifiers are arranged in columns. Also, a plurality of reference cells are provided in two rows. The reference cell is composed of a transistor and a capacitor of the capacitance less than the capacitance of the capacitor of the memory cell. In practical case, a pair of reference cells are coupled to a pair of digit lines which are coupled to a pair of input terminals of a differential type sense amplifier in each of columns.

When a read operation is performed, one memory cell coupled to a selected word line produces a data signal stored therein to one of a pair of digit lines and one reference cell coupled to the other digit line of the same pair of digit lines is enabled so that the capacitor of the enabled reference cell is electrically coupled to the other digit line, in each column. The reference cell provides to the other digit line with a reference level of the binary logic levels stored in the memory cell so that the sense amplifier detects the data stored in the memory cell by comparing it with the reference level.

In general, the transistors of the memory cells and the reference cells are MOS field effect transistors and the capacitors of the memory cells and reference cells are MOS capacitors which utilize a surface portion of a semiconductor substrate as a lower electrode and a polycrystalline silicon layer formed above the opposite conductivity region via a thin layer of dielectric layer such as silicon dioxide layer. Such surface portion is usually an inversion or depletion region formed at the surface of the substrate.

Heretofore, the capacitors of the memory cells and the capacitors of the reference cells are fabricated through the same manufacturing steps and the capacitance of the capacitors of the reference cells is made smaller than that of the memory cells (e.g. one-half of the memory cell capacitor) by setting area of the capacitors of the reference cells smaller than that of the memory cells.

However, accompanied by recent increase in the memory capacity, the areas for the capacitors of the memory cells and the reference cell have become greatly reduced. As a result, deviations in areas of the capacitors of the reference cell and the memory cell have become comparatively large. Particularly, it has become difficult to keep the ratio of the areas between the capacitor of the reference cell and the capacitor of the memory cell at a designed, desired value.

The above increase in the comparative deviation in the capacitance of the reference cell capacitor with respect to the memory cell capacitor lowers operation margin in reading operations and also lowers yields of the memory devices.

SUMMARY OF THE INVENTION:

It is an object of the present invention to provide a memory device which has an improved operational margins.

It is another object of the present invention to provide a dynamic type memory device having a desired ratio of the reference cell capacitor and the memory cell capacitor.

The dynamic type semiconductor memory device according to the present invention comprises a plurality of memory cells each including a memory cell capacitor and a plurality of reference cells each including a reference cell capacitor having a smaller capacitance than that of the memory cell capacitor, and is featured in that a dielectric layer of the reference cell capacitor is made of such material having a smaller effective dielectric constant than that of the memory cell capacitor.

According to one aspect of the present invention, the reference cell capacitor is formed with the same size and configuration, i.e. the same plan pattern, as the memory cell capacitor. In other words, according to the present the reference cell capacitor is formed in the same physical configuration as the memory cell capacitors except for a material of its dielectric layer and the dielectric constant of the dielectric layer of the reference cell capacitor has a smaller value than that of the memory cell capacitor. For example, in the case where the capacitance of the reference cell capacitor is to be a half that of the memory cell capacitor, the dielectric layer of the reference cell is made of the material, the dielectric constant of which is a half the dielectric constant of the dielectric layer of the memory cell capacitor.

According to the present invention, both of the memory cell capacitor and the reference cell capacitor are fabricated in the same pattern, the capacitance ratio of the reference cell capacitor to the memory cell capacitor is solely determined by the dielectric constant ratio of the dielectric layer of the reference cell capacitor to that of the memory cell capacitor, without being affected by deviation in patterns of the reference cell capacitor and the memory cell capacitor.

BRIEF DESCRIPTION OF THE DRAWINGS:

FIG. 1 is a schematic circuit diagram of a dynamic type semiconductor device;

DETAILED DESCRIPTION OF THE INVENTION:

Referring to FIG. 1, a general circuit arrangement of a dynamic type semiconductor memory device will be explained.

A plurality of word lines $W_1$, $W_2$, $W_3$... and dummy word lines $WR_1$ and $WR_2$ are arranged in rows and a plurality of pairs of digit lines $D_1$, $\overline{D_1}$; $D_2$, $\overline{D_2}$... are arranged columns. Differential type sense amplifiers $SA_1$, $SA_2$ are connected to the pairs of digit lines $D_1$, $\overline{D_1}$; $D_2,\overline{D_2}$ ... A plurality of memory cells each composed of a transfer gate MOS transistor $Q_S$ and a memory cell capacitor $C_S$ and a plurality of reference cells $R_C$ each composed of a transfer gate MOS transistor $Q_R$ and a reference cell capacitor $C_R$ are arranged in a known way, as illustrated. A plurality of precharge transistors $Q_P$ are provided for the respective digit lines.

The capacitance of the reference cell capacitor $C_R$ is set smaller than that of the memory cell capacitor $C_S$, and the capacitance ratio of $C_R$ to $C_S$ is usually at 1:2.

In a read operation, one of the word lines, e.g. W1 is selected and one of the dummy word lines, e.g. WR2 are selected so that the memory cell capacitor $C_S$ of the memory cell coupled to W1 and the reference cell capacitor $C_R$ of the reference cell coupled to WR2 are electrically connected to the digit lines $D_1$ and $\overline{D_1}$, respectively which have been precharged to a precharge potential such as a power voltage Vcc. The reference cell capacitors $C_R$ also have been precharged to the precharge potential. Thus, a small change occurs in the digit line $D_1$ according to a data signal stored in the memory cell, and then the sense amplifier SA1 is enabled to discharge electric charges on the digit line of the lower potential side thereby to enlarge potential difference between the pair of digit lines $D_1$ and $\overline{D_1}$ in a known manner.

In the conventional memory device, the reference cell capacitors $C_R$ are formed in a smaller area as compared to the memory cell capacitors $C_S$. Accompanied recent great in crease in the memory capacity of memories, the size of the memory cells, particularly the memory cell capacitors has been reduced to the minimum and therefore, it has become difficult to fabricate the reference cell capacitors in a further reduced area with a predetermined ratio of $C_R$ to $C_S$.

Figure 2A:
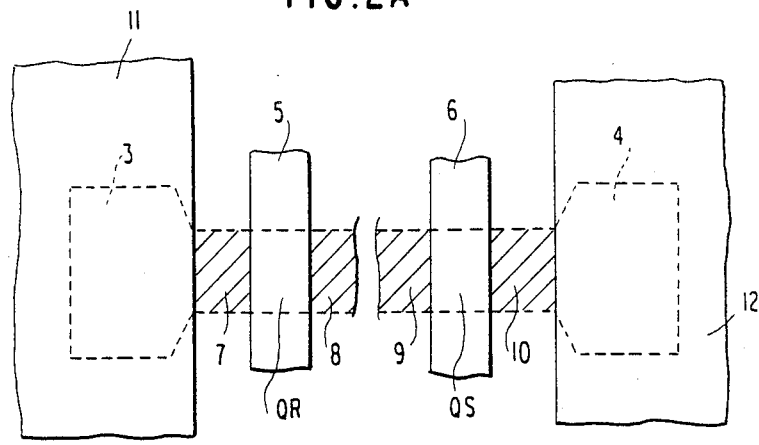
FIGS. 2A and 2B are plan view and sectional view of the memory cell and the reference cell according to one embodiment of the invention, respectively.
Figure 2B:
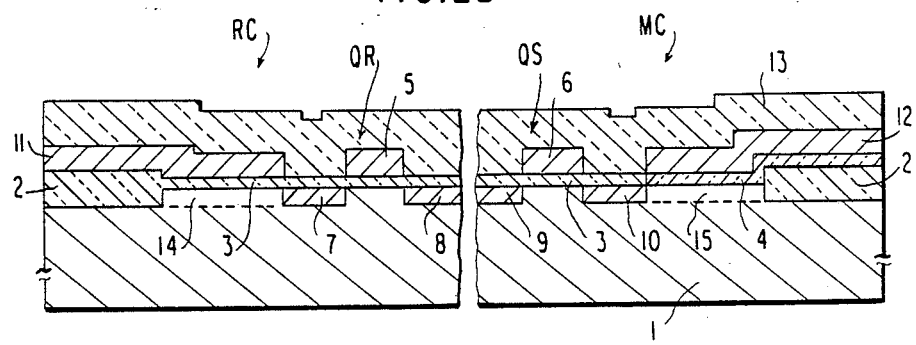

With reference to FIGS. 2A and 2B, a major part, i.e. the memory cell MC and the reference cell RC of the memory device according to one embodiment of the present invention will be explained.

In FIGS. 2A and 2B, the reference cell RC is illustrated in the left side and the memory cell MC is illustrated in the right side of a P-channel type semiconductor substrate 1.

A field oxide layer 2 is formed on inactive regions for isolation of active regions on which the memory cells MC and the reference cells RC are formed. A thin layer 3 of silicon dioxide is formed on the surface of the substrate 1 on the reference cell formation region and the transistor $Q_S$ of the cell MC. N type regions 7 and 8 serve as a source and a drain of the transistor $Q_R$ of the reference cell RC and N type regions 9 and 10 serve as a source and a drain of the transistor $Q_S$ of the memory cell MC. Polycrystalline silicon stripes 6 and 5 serve as the word line and the dummy word line and also as silicon gates of the transistors $Q_R$ and $Q_S$, respectively. A polycrystalline silicon layer 11 is formed as an upper electrode of the reference cell capacitor $C_R$ via the thin oxide layer 3 and an inversion or depletion region 14 serves as a lower electrode of the capacitor $C_R$. Thus, the reference cell capacitor $C_R$ is composed of the polycrystalline silicon layer 11, the thin oxide layer 3 as a dielectric layer and the inversion or depletion region 14.

While a thin silicon nitride ($Si_3N_4$) layer 4 is formed as a dielectric layer of the memory cell capacitor $C_S$ of the memory cell MC. A polycrystalline silicon layer 12 formed the silicon nitride layer 4 serves as an upper electrode of the capacitor $C_S$ while an inversion or depletion layer 15 serves as a lower electrode of the capacitor $C_S$.

When inversion layers are used for the layers 14 and 15, the polycrystalline silicon layers 11 and 12 are basied by the power supply voltage for causing such inversion layers. When depletion regions are used for the layers 14 and 15, N-type impurities are doped thereto for the formation of the layers 14 and 15.

A phosphrous silicate glass (PSG) 13 is formed on the entire surface of the substrate 1. The thin oxide layer 3 and the silicon nitride layer 4 have approximately the same thickness and for example are 400 angstroms. As is shown in FIGS. 2A and 2B, the memory cell MC and the reference cell RC have the same configuration except for the materials of the dielectric layers 3 and 4.

The dielectric constant of the silicon dioxide is approximately 3.5 while the dielectric constant of the silicon nitride is approximately 7.0. Therefore, the capacitance ratio of the reference cell capacitor $C_R$ to the memory cell capacitor $C_S$ is accurately set at 1:2. Thus, without differenciating the configurations of the memory cell MC and the reference cell RC, a predetermined capacitance ratio can be established between the memory cell capacitor and the reference cell capacitor.

With reference to FIGS. 3A to 3G, a preferred example of manufacturing of the memory device will be explained.

Figure 3A:
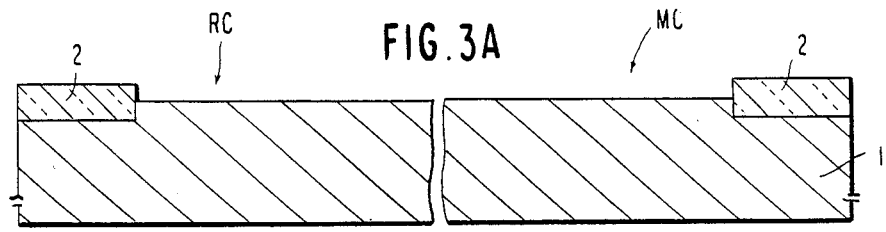
FIGS. 3A to 3G are sectional views of the respective steps in fabricating the memory cell and the reference cell shown in FIGS. 2A and 2B.
Figure 3B:
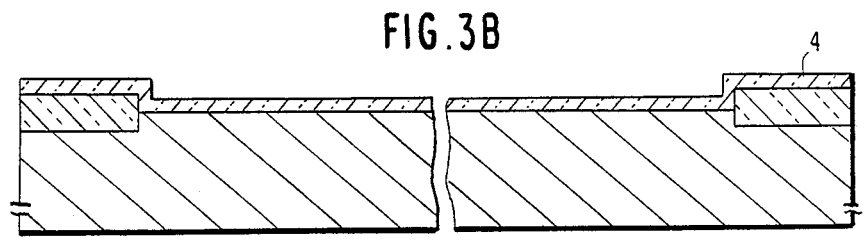
Figure 3C:
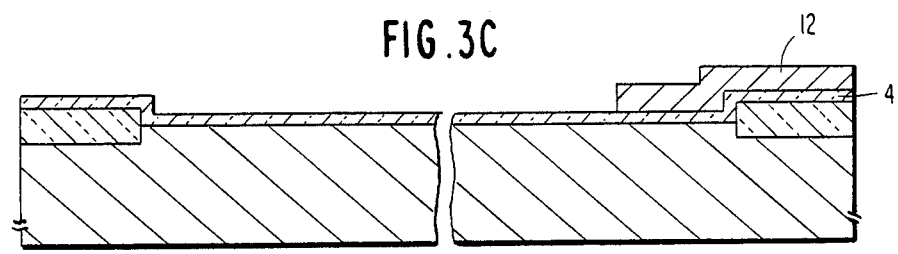

First, as shown in FIG. 3A, a field oxide layer 2 is formed by known thermal oxidation with a thickness of 1 micron. Then, a silicon nitride layer 4 is formed on the entire surface of the substrate 1 by CVD technique. The thickness of the silicon nitride layer 4 is 400 angstroms. Then, a polycrystalline silicon layer 12 as the upper electrode of the memory cell capacitor $C_S$ is formed, as illustrated in FIG. 3C. A thickness of the polycrystalline silicon layer 12 is approximately 0.5 micron.

Figure 3D:
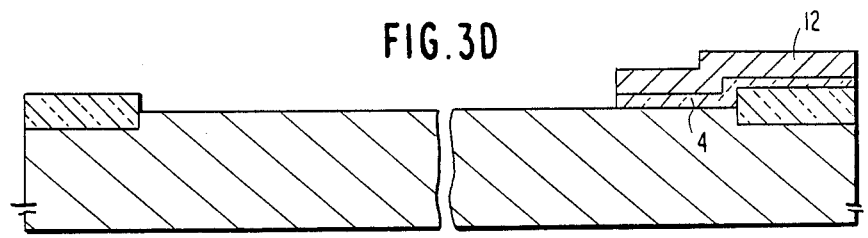

Subsequently, an exposed portion of the silicon nitride layer 4 (not covered by the polycrystalline silicon layer 12) is etched away by using the polycrystalline silicon layer 12 as an etching mask, as shown in FIG. 3D.

Figure 3E:
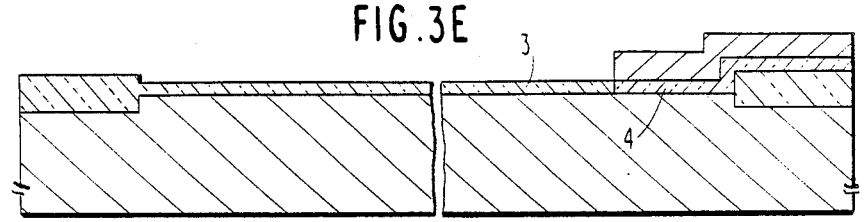

Then, a thin silicon dioxide layer 3 of a thickness 400 angstroms is formed by a thermal oxidation technique, as shown in FIG. 3E.

Figure 3F:
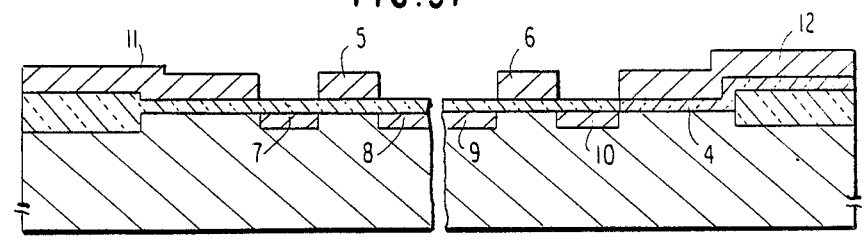
Figure 3G:
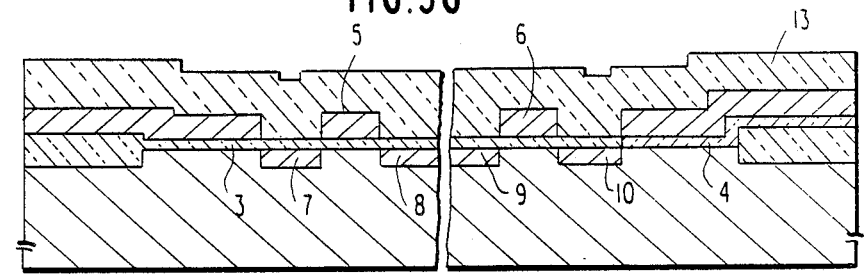

Subsequently, a polycrystalline silicon layer is formed over an entire surface of the substrate 1. The thickness of the polycrystalline silicon layer is about 0.5 micron. Then, the polycrystalline silicon layer is patternized by know photo-etching method to form the layer 11 serving as the upper electrode of the reference cell capacitor CR and the dummy word line 5 and the word line 6. After formation of the word lines 5 and 6 and the layer 11, N-type impurities such as As are introduced by ion implantation technique to the substrate 1 so that N-type regions 7 to 10 are formed, as shown in FIG. 3F. In this instance, the polysilicon patterns 5, 6, 11 and 12 serve as masks for the impurity introduction.

Finally, a PSG layer 13 as the passivation layer is formed over the entire surface of the substrate 1. The thickness of the PSG layer 13 is about 1.0 micron.

Figure 4:
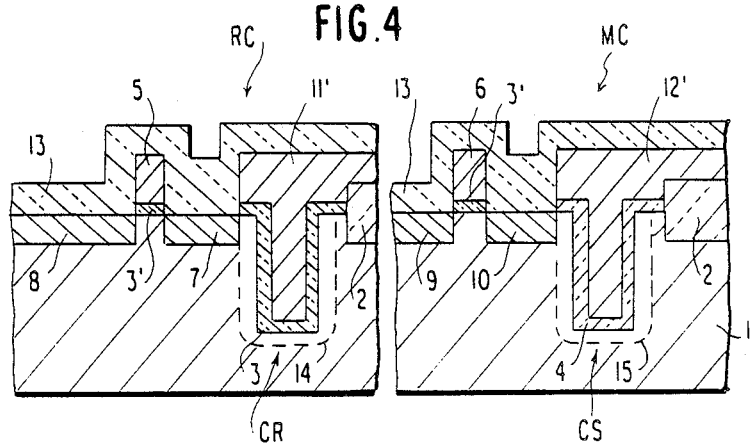
FIG. 4 is a sectional view of the memory cell and the reference cell according to another embodiment of the present invention.

With reference to FIG. 4, a major part of the memory device according to another embodiment will be explained.

In FIG. 4, the portions or elements corresponding to those in the previous embodiment are denoted by the same or similar references.

According to this embodiment, the so-called trench type capacitor structure is employed for the reference cell capacitor $C_R$ and the memory cell capacitor $C_S$. The dielectric layer 3 of the capacitor $C_R$ is made of a silicon dioxide of a thickness 400 angstroms while the dielectric layer 4 of the capacitor $C_S$ is made of a silicon nitride of a thickness 400 angstroms.

The polycrystalline silicon 11' and the depletion region 14 serve as the upper and lower electrodes of the capacitor $C_R$ while the polycrystalline silicon 12' and the depletion region 15 serve as the upper and lower electrodes of the capacitor $C_S$. The N-type regions 7 and 8 and the silicon gate 5 formed via the thin silicon dioxide form the transistor $Q_R$. The N-type regions 9, and 10 and the silicon gate 6 formed via the thin silicon dioxide layer 3' form the transistor $Q_M$.

The size and the configuration of the reference capacitor $C_R$ are the same as those of the memory cell capacitor $C_M$ except for the materials of the dielectric layers 3 and 4, as explained above.

Thus, the capacitance ratio of the capacitor $C_R$ to the capacitor $C_S$ is accurately determined in proportion to the dielectric constant ratio of the dielectric layer of the capacitor $C_R$ to that of the capacitor $C_S$.

Particularly, the present invention is greatly advantageous for the trench-type capacitors because it is difficult to establish an accurate capacitance ration between the trench-type capacitors by varying the sizes of those capacitors.

I claim:

1. A semiconductor device comprising a semiconductor substrate, a first capacitor formed on said semiconductor substrate, said first capacitor including a first surface portion of said semiconductor substrate, a first dielectric layer formed on said first surface portion and a first conductive layer formed on said first dielectric, a second capacitor formed on said semiconductor substrate, said second capacitor including a second surface portion of said semiconductor substrate, a second dielectric layer formed on said second surface portion and a second conductive layer formed on said second dielectric layer, said second surface portion having substantially the same pattern and size as said first surface portion, said second dielectric layer having a smaller value of dielectric constant than said first dielectric layer, whereby a capacitance ratio of said second capacitor to said first capacitor is substantially determined according to a dielectric constant ratio of said second dielectric layer to said first dielectric layer.

2. The semiconductor device according to claim 1, in which each of said first and second conductive layers is made of polycrystalline silicon.

3. The semiconductor device according to claim 1, in which said first dielectric layer is made of silicon nitride and said second dielectric layer is made of silicon dioxide.

4. The semiconductor device according to claim 1, in which each of said first and second surface regions is made of a depletion region of an opposite conductivity type to said semiconductor substrate.

5. A semiconductor device comprising a semiconductor substrate; a plurality of memory cells formed on said semiconductor substrate, each of said memory cells including a series connection of a first transistor and a first capacitor, said first capacitor including a first surface portion of said semiconductor substrate, a first dielectric layer formed on said first surface portion and a first conductive layer formed on said first dielectric layer; and a plurality of reference cells formed on said semiconductor substrate, each of said reference cells including a series connection of a second transistor and a second capacitor, said second capacitor including a second surface portion of said semiconductor substrate, a second dielectric layer formed on said second surface portion and a second conductive layer, said second surface portion and said first surface portion being formed in substantially the same pattern, a dielectric constant of said second dielectric layer is smaller in value than that of said first dielectric layer, a capacitance of said second capacitor being smaller than that of said first capacitor.

6. The semiconductor device according to claim 5, in which said first dielectric layer is made of silicon nitride and said second dielectric layer is made of silicon dioxide.

7. The semiconductor device according to claim 5, in which each of said first and second conductive layer is made of polycrystalline silicon.

8. The semiconductor device according to claim 5, in which said first surface portion and said second surface portion are trench-shaped regions formed in said semiconductor substrate.

* * * * *

UNITED STATES PATENT AND TRADEMARK OFFICE
CERTIFICATE OF CORRECTION

PATENT NO. : 4,931,849
DATED : June 5, 1990
INVENTOR(S) : Tajima

It is certified that error appears in the above-identified patent and that said Letters Patent is hereby corrected as shown below:

Col. 3, line 3, delete "$D_1$; $D_2$, $D_2$" and insert --$\overline{D_1}$; $D_2$, $\overline{D_2}$--.

Col. 3, line 18, delete "$D_1$ and $D_1$" and insert --$D_1$ and $\overline{D_1}$--.

Signed and Sealed this

Third Day of September, 1991

Attest:

HARRY F. MANBECK, JR.

Attesting Officer

Commissioner of Patents and Trademarks